United States Patent
Van Zeghbroeck et al.

(10) Patent No.: US 7,241,699 B2
(45) Date of Patent: Jul. 10, 2007

(54) WIDE BANDGAP SEMICONDUCTOR DEVICE CONSTRUCTION

(75) Inventors: Bart J. Van Zeghbroeck, Boulder, CO (US); Ivan Perez, Boulder, CO (US); John T. Torvik, Louisville, CO (US)

(73) Assignee: Microsemi Corp., Bend, OR (US)

( * ) Notice: Subject to any disclaimer, the term of this patent is extended or adjusted under 35 U.S.C. 154(b) by 179 days.

(21) Appl. No.: 10/630,238

(22) Filed: Jul. 30, 2003

(65) Prior Publication Data

US 2004/0082191 A1    Apr. 29, 2004

Related U.S. Application Data

(60) Provisional application No. 60/399,957, filed on Jul. 30, 2002.

(51) Int. Cl.
*H01L 21/302* (2006.01)
(52) U.S. Cl. .................. 438/745; 438/17; 438/750
(58) Field of Classification Search .................. 438/10, 438/17, 745, 750, 751
See application file for complete search history.

(56) References Cited

U.S. PATENT DOCUMENTS

| | | | |
|---|---|---|---|
| 4,314,266 A * | 2/1982 | Temple | 257/160 |
| 4,945,394 A | 7/1990 | Palmour et al. | 357/34 |
| 5,266,503 A | 11/1993 | Wang et al. | 437/24 |
| 5,418,188 A * | 5/1995 | Harper et al. | 438/664 |
| H1637 H | 3/1997 | Offord et al. | 437/173 |
| 5,914,611 A | 6/1999 | Cheng | 324/719 |
| 6,034,001 A * | 3/2000 | Shor et al. | 438/695 |
| 6,180,958 B1 | 1/2001 | Cooper, Jr. | 257/77 |
| 6,181,200 B1 | 1/2001 | Titizian et al. | 330/66 |
| 6,218,254 B1 | 4/2001 | Singh et al. | 438/364 |
| 6,228,665 B1 | 5/2001 | Griffith et al. | 438/14 |
| 6,303,475 B1 | 10/2001 | Suvorov et al. | 438/519 |
| 6,313,482 B1 | 11/2001 | Baliga | 257/77 |
| 6,323,506 B1 | 11/2001 | Alok | 257/77 |
| 6,329,675 B2 | 12/2001 | Singh et al. | 257/77 |
| 6,331,931 B1 | 12/2001 | Titizian et al. | 361/306.3 |
| 6,790,685 B2 * | 9/2004 | Lee | 438/14 |

OTHER PUBLICATIONS

Article entitled "Silicon Carbide Bipolar Transistor" by W. V. Munch and P. Hoeck published in *Solid State Electronics*, 1978, vol. 21, pp. 479-480, Pergamon Press, Great Britain.

Excerpt from textbook vol. V *Introduction to Microelectronic Fabrication*, pp. 71-73, author Ricahrd C. Jaeger, Auburn University, published by Addison-Wesley Publishing Company, reprinted with corrections May, 1993.

(Continued)

*Primary Examiner*—Lan Vinh
(74) *Attorney, Agent, or Firm*—Marsh Fischmann & Breyfogle LLP

(57) ABSTRACT

The invention includes methods for precisely and accurately etching layers of wide bandgap semiconductor material. According to one aspect of the invention, the method includes providing a multi-layer laminate including at least a first and second layer of wide bandgap semiconductor material, measuring a first conductance of the first layer of semiconductor material, partially etching the first layer of semiconductor material a first amount, measuring a second conductance of the first layer of semiconductor material etched the first amount, and utilizing the first and second measured conductance to determine a time required to etch the first layer of semiconductor material a second amount.

29 Claims, 18 Drawing Sheets

OTHER PUBLICATIONS

U.S. Appl. No. 10/360,662, filed on Feb. 7, 2003, entitled "Method of Fabricating Self-Aligned Silicon Carbide Semiconductor Devices".

U.S. Appl. No. 10/339,040, filed on Jan. 9, 2003, entitled "Silicon Carbide Semiconductor Devices with a Regrown Contact Layer".

* cited by examiner

WIDE BANDGAP SEMICONDUCTOR DEVICE CONSTRUCTION

RELATED APPLICATIONS

This patent application claims priority from U.S. Patent Application Ser. No. 60/399,957, that was filed on Jul. 30, 2002, and that is entitled "SILICON CARBIDE BIPOLAR JUNCTION TRANSISTOR FABRICATION PROCESSES." The entire disclosure of U.S. Patent Application Ser. No. 60/399,957 is incorporated herein by reference.

GOVERNMENT INTERESTS

At least a portion of the work related to the invention described herein was made in the performance of work under a Government contract No. N00014-99-C-0332. All rights possessed by the U.S. Government in this subject matter are governed by the terms of that contract.

FIELD OF THE INVENTION

The present invention generally relates to wide bandgap semiconductor devices, and in particular, to methods of constructing the same.

BACKGROUND OF THE INVENTION

Wide bandgap semiconductor devices are devices constructed from wide bandgap materials, e.g. generally having an energy gap greater than 2.5 eV, such as Silicon Carbide (SiC), Zinc Sulfide, and Gallium, Aluminum, and Indium Nitride related compounds. Wide bandgap semiconductor materials typically include properties that are desirable for constructing power devices, including, among other things, a wide bandgap, a high thermal conductivity, high breakdown field strength, and a high electron saturation velocity. One example of such a power device is a bipolar junction transistor (BJT). BJT's are well-known and frequently used semiconductor devices that are generally defined by two back-to-back p-n junctions formed in a semiconductor material in close proximity. In operation, current enters a region of the semiconductor material adjacent one of the p-n junctions called the emitter. Current exits the device from a region of the material adjacent the other p-n junction called the collector. The collector and emitter have the same conductivity type and include a thin layer of semiconductor material having the opposite conductivity positioned between them, referred to as the base.

One of the requirements for an operable and useful device is an appropriate semiconductor material from which it can be formed. The most commonly used material is silicon (Si), with recent attention being paid to materials such as Gallium Arsenide (GaAs) and Indium Phosphide (InP). While the potential of SiC is recognized, appropriate techniques for producing devices is lacking, because the requirements of specific devices are often difficult to achieve using SiC. For instance, performance optimization in a device, such as a BJT for an RF power amplifier, requires minimizing base resistance, maximizing power densities, and minimizing parasitics. To accomplish these characteristics, the geometry and spacing of the thin base layer and the thicker emitter layer, as well their respective contacts, must be carefully controlled. Furthermore, such devices require careful control of the conductivity and thickness of the layers to achieve desired oscillation frequencies and power gains.

As will be appreciated by those skilled in the art, such careful control of layer thickness requires precise etching. This is especially true in constructing BJT devices from SiC, as the thicker emitter layer must be accurately etched away without removing the thin base layer, which directly influences the device performance. Unfortunately, however, conventional SiC etching methods do not always result in uniform etch times, even where the layer thickness is known, thereby making it difficult to accurately control etching during device construction.

SUMMARY OF THE INVENTION

In view of the foregoing, a primary object of the present invention is to provide improved methods of constructing wide bandgap semiconductor devices. Another object of the present invention is to improve material etching during the construction of wide bandgap semiconductor devices.

In addressing the above-described problems, the present inventors have recognized that the above objectives may be achieved by using the relationship between the layer thickness of a wide bandgap semiconductor material and the conductance of the same. Furthermore, the present inventors have recognized that the time required to etch a given layer of interest a desired amount, may be determined using this relationship, even where the initial layer thickness remains unknown. In particular, a corresponding relationship may be made between an initial measured conductance of a layer of interest and a subsequent measured conductance of the same layer following a partial etching of the layer. This corresponding relationship, in turn, is employable to calculate a time required to etch the layer of interest a further desired amount. In addition, the present inventors have recognized that for a given batch of material, e.g. n-p or p-n material stack, a single test device may be constructed according to the present method, and thereafter multiple devices may be constructed from the same material batch using the etch times determined during construction of the test device, without repetition of the present methods.

In this regard, one or more of the above objectives and additional advantages may be realized by a first aspect of the present invention, which provides a method for precisely etching a wide bandgap semiconductor device. The method includes, in a wide bandgap semiconductor device including a first and second semiconductor material layer, measuring a conductance of a layer of interest, etching a first amount of material from the layer of interest, measuring a second conductance of the layer of interest, and using the measured conductance to determine an etch time to remove a second amount of material from the layer of interest.

Various refinements exist of the features noted in relation to the subject first aspect of the present invention. Further features may also be incorporated in the subject first aspect as well. These refinements and additional features may exist individually or in any combination. For instance subsequent to determining the etch time, the layer of interest may be etched the determined amount of time to remove the second amount of material. In this regard, the etching step may include etching at least a portion of the layer of interest down to a junction between the layer of interest and an adjacent layer. Alternatively, the etching step may include etching at least a portion of the layer of interest down to a predetermined desired thickness.

In one embodiment according to the present invention, subsequent to etching the second amount of material from the layer of interest, the conductance may again be measured and an iterative technique employed, whereby etching times are determined between etching steps, and thereafter employed to precisely and controllably etch the layer of interest a predetermined desired amount. Such an iterative process, in turn, results in an total optimal etch time for a given layer of interest, which as noted above, may be utilized to construct additional devices from the same material batch, e.g. n-p or p-n material stack, without repetition of the present method.

According to another embodiment of the present invention, the method may further include the step of, prior to measuring the conductance, isolating an area of the layer of interest for locating a conductance measurement device. According to this characterization, the conductance measurement device may be a probe device that utilizes a current provided through a first pair of probes, while a second pair of probes reads a voltage drop created across the layer of interest, from which, a layer conductance (C) may be calculated using the relationship between current, voltage, and conductance, e.g. conductance=current/voltage. Advantageously, the present isolation step improves the accuracy of the conductance measurement by minimizing current leakage and the influence of other features, such as emitter mesas in close proximity and/or defects in the semiconductor material.

According to another embodiment of the present invention the time to remove the second amount of material from the layer of interest may be determined using a difference between the first measured conductance and the second measured conductance in combination with a time required to complete the first etching step. In this regard, it will be appreciated that given a substantially linear relationship between layer conductance and layer thickness, e.g. conductance reduces linearly with thickness, the first and second measured conductance and time to complete the first etching step may be utilized to calculate a time at which the layer conductance is zero. Similarly, it will be appreciated that the same may further be employed to determine an etch time and/or conductance corresponding to a layer thickness of a predetermined amount, such that a layer may be etched to either a layer junction or predetermined layer thickness. In other words, according to one example of the present method, the measuring and etch steps may be iteratively repeated to identify an optimum etch depth for a layer of interest as well as an optimal etch time to achieve the optimal etch depth.

These refinements and embodiments as well as additional features may exist individually or in any combination. Furthermore, additional aspects, advantages and applications of the present invention will be apparent to those skilled in the art upon consideration of the following

DETAILED DESCRIPTION

Reference will now be made to the accompanying drawings, which at least assist in illustrating the various pertinent features of the present invention. In this regard, the following description is presented for purposes of illustration and description and is not intended to limit the invention to the form disclosed herein. Consequently, variations and modifications commensurate with the following teachings, and skill and knowledge of the relevant art, are within the scope of the present invention. The embodiments described herein are further intended to explain the best modes known of practicing the invention and to enable others skilled in the art to utilize the invention in such, or other embodiments and with various modifications required by the particular application(s) or use(s) of the present invention. As such, the following description sets forth an exemplary SiC BJT structure and associated processes that involve regrowth, self-alignment, and other features and advantages commensurate with the present invention.

Figure 1:
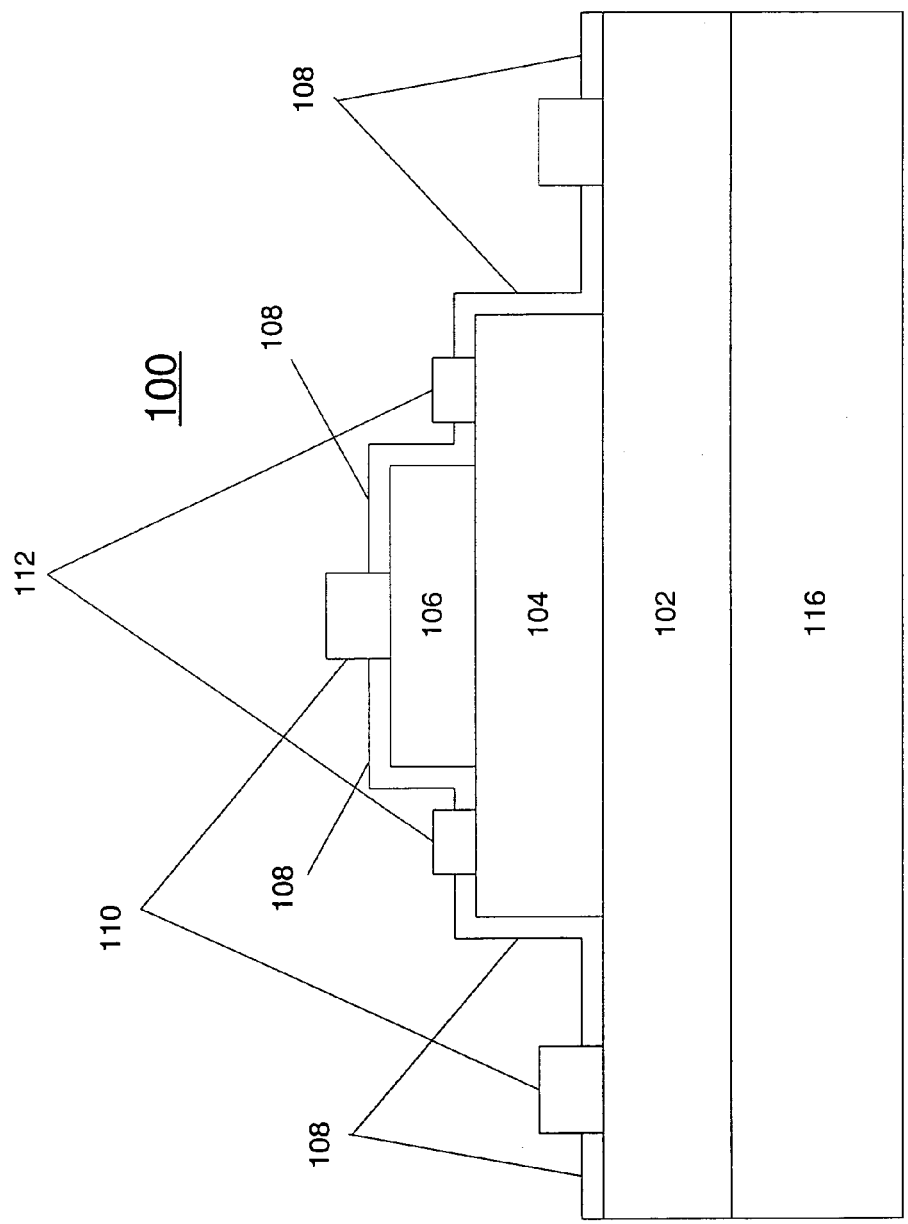
FIG. 1 illustrates an example of a wide bandgap semiconductor device formed in accordance with the principles of the present invention.

Referring to FIG. 1, the following description discloses an example of a wide bandgap semiconductor device, and in particular a SiC BJT device 100. In the context of the present invention, some examples of wide bandgap semiconductor devices include devices constructed from SiC, Zinc Sulfide, as well as devices constructed from Gallium, Aluminum, and Indium Nitride related compounds. It will be appreciated that the present example is provided for purpose of illustration and that other devices and materials are therefore possible and contemplated in accordance with the present invention. For instance, one skilled in the art will readily appreciate that the described principles may be applied to construct devices such as a junction, a diode, a thyristor, and/or a transistor.

As will be appreciated from the following description, the present invention provides methods for precisely and accurately etching material in wide bandgap semiconductor devices. In this regard, the present methods employ a technique whereby an optimum layer thickness and etching time required to achieve the same is determined between etching steps to a predeterminable degree of accuracy using conductance measurements of the layer of interest. In this regard, the present methods may be utilized, for example, during the construction of a single device, e.g. "test device," from a batch of material. Thereafter, the etch depth(s), and time(s) required to achieve the same, determined from the test device, may be utilized to construct multiple other devices in a repeatable manner from the same material batch, without repetition of the present methods.

Additionally, in at least one particular application, the present invention also provides methods for testing bipolar devices during construction of the same to determine current gain and other characteristics of interest indicative of device quality, as well as optimal etching depths for maximizing the device quality. Advantageously, this permits optimization of a single device, as noted above, and thereafter construction of multiple other devices in a repeatable manner from the same material batch, without repetition of the present methods.

The device 100 includes three distinct SiC semiconductor regions, namely, an emitter region 106, a base region 104, and collector region 102. The transistor 100 further includes a passivation layer 108, a substrate 116, e.g. a SiC wafer, contacts 110 on the n-type layers, and contacts 112 on the p-type layer. As will be appreciated by one skilled in the art, contacts 110 may be for example, made of nickel, while the contracts 112 may be made of for example, an aluminum titanium alloy. Furthermore, the base layer 104 may be a thin and heavily doped layer, e.g., having a nominal thickness of less than 200 nm and a doping density in the range of $2-8\times10^{18}$ cm$^{-3}$. According to this characterization, the thickness and doping of the emitter layer 106 may be 200 nm and $1\times10^{19}$ to $4\times10^{19}$ cm$^{-3}$ respectively, while the thickness and doping of the collector layer 102 may be 1000 nm to 3000 nm and $2\times10^{15}$ to $8\times10^{16}$ cm$^{-3}$ respectively. Alternatively, it will be appreciated that the device 100 may be fabricated on a semi-insulating SiC substrate so that multiple transistors may be made on the same substrate without having a common collector contact. In this case, the collector layers are electrically isolated by either removing the collector layer through etching or by making the collector insulating though ion implantation and/or oxidation.

Unless otherwise specified, the forming processes involved in fabricating the device 100 may include, but are not limited to, various CVD processes such as microwave plasma CVD, RF plasma CVD, photo-CVD, thermal CVD, and MOCVD, various deposition processes such as electron beam evaporation, and sputtering, among others, as well as various etch processes including reactive ion etching and high temperature anneal and oxidation processes. In this regard, the transistor 100 can be made both with n-p-n and p-n-p conductivity type for the emitter layer 106, base layer 104, and collector layer 102 respectively, but the n-p-n structure is preferred as it includes superior transport properties due to higher electron mobility compared to hole mobility. It should also be noted that SiC crystallizes in over 150 polytypes or crystal structures, although the most common structures include those known as 3C, 4H, and 6H, where "C" means 'cubic' and "H" means 'hexagonal.' While the principles of the present invention apply equally to at least those structures known as 3C, 4H, and 6H, preferably the device 100 is made from 4H SiC, as 4H-SiC includes higher electron mobility along the C-axis, e.g., as compared to say 6H-SiC.

Figure 2:
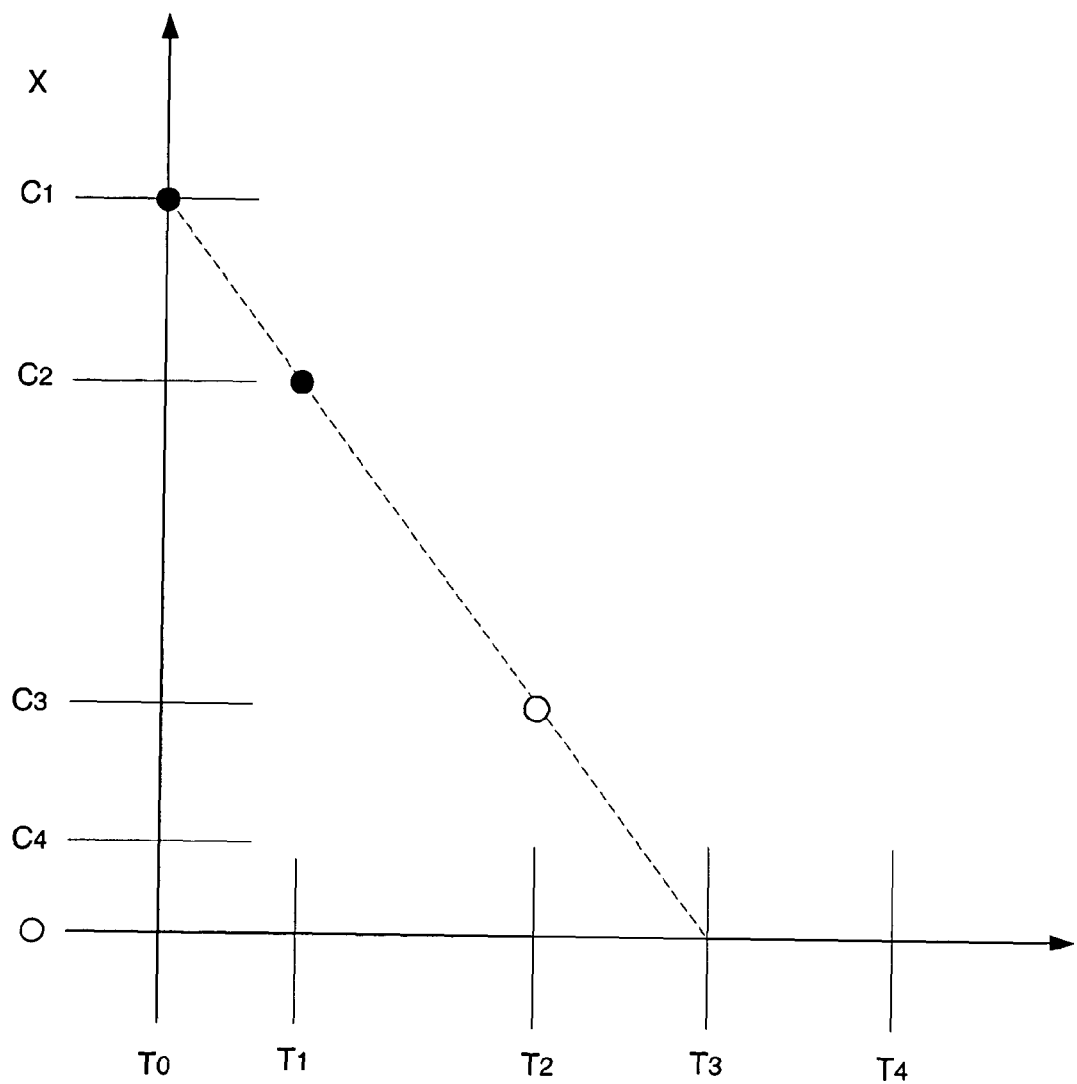
FIG. 2 is a graphical illustration of the relationship between layer conductance and etch time in a wide bandgap semiconductor device.

As noted above, a difficulty associated with forming devices from wide bandgap semiconductor materials relates to controlling etching processes, such that a precise geometry and spacing is achieved between the layers. For example, in the case of the device 100, the spacing between the base layer 104 and the emitter layer 106. More particularly, the above problem relates to the difficulty in controlling the thickness and doping densities of epitaxially grown layers of for example an SiC material stack, thereby resulting in a lack of definition between layer junctions. This in turn results in a difficulty in determining etching times for a given material stack, required to precisely remove a layer or portions thereof down to a predetermined thickness during device construction. Advantageously, the present invention addresses this apparent obstacle by providing methods for precisely and accurately etching wide bandgap semiconductor material layers. In this regard, the present methods include measuring a layer conductance between at least one etching step, to obtain data for calculating an etch time required to precisely and accurately etch/remove a remaining amount of material down to a predefined optimal thickness. Further in this regard, the present invention takes advantage of the principle that layer conductance reduces substantially linearly with the depth of the etch, such that a corresponding relationship may be determined between etch times and layer conductance, as illustrated in FIG. 2.

According to one embodiment, the etch process utilized during construction of a wide bandgap semiconductor device, such as device 100, from a given material stack, generally includes: 1) measuring a conductance of a layer of interest, 2) etching a first amount of material from the layer of interest, 3) measuring a second conductance of the layer of interest, and 4) determining an etch time to remove a second desired amount of material from the layer of interest. According to this method, a corresponding relationship between the layer conductance and etch times, as graphically depicted on FIG. 2, may be utilized to determine the etch time required to etch the remaining amount of material the desired amount. Advantageously, and as will be appreciated from the following example, the present method may also be iteratively employed to generate additional data for improving the accuracy of determined etch times.

Figure 3:
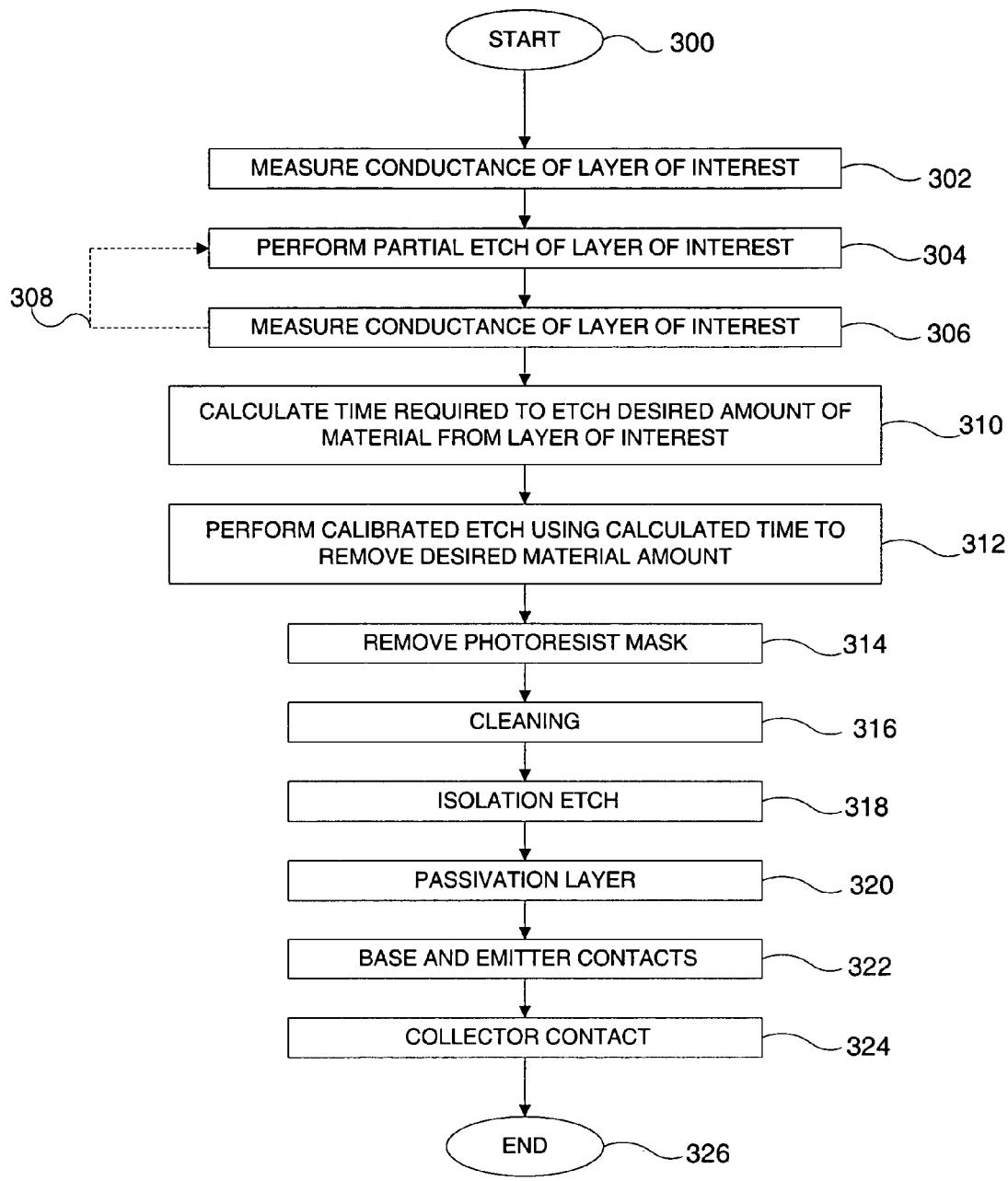
FIG. 3 is a flow chart illustrating one example of a method of etching a wide bandgap semiconductor device.
Figure 4:
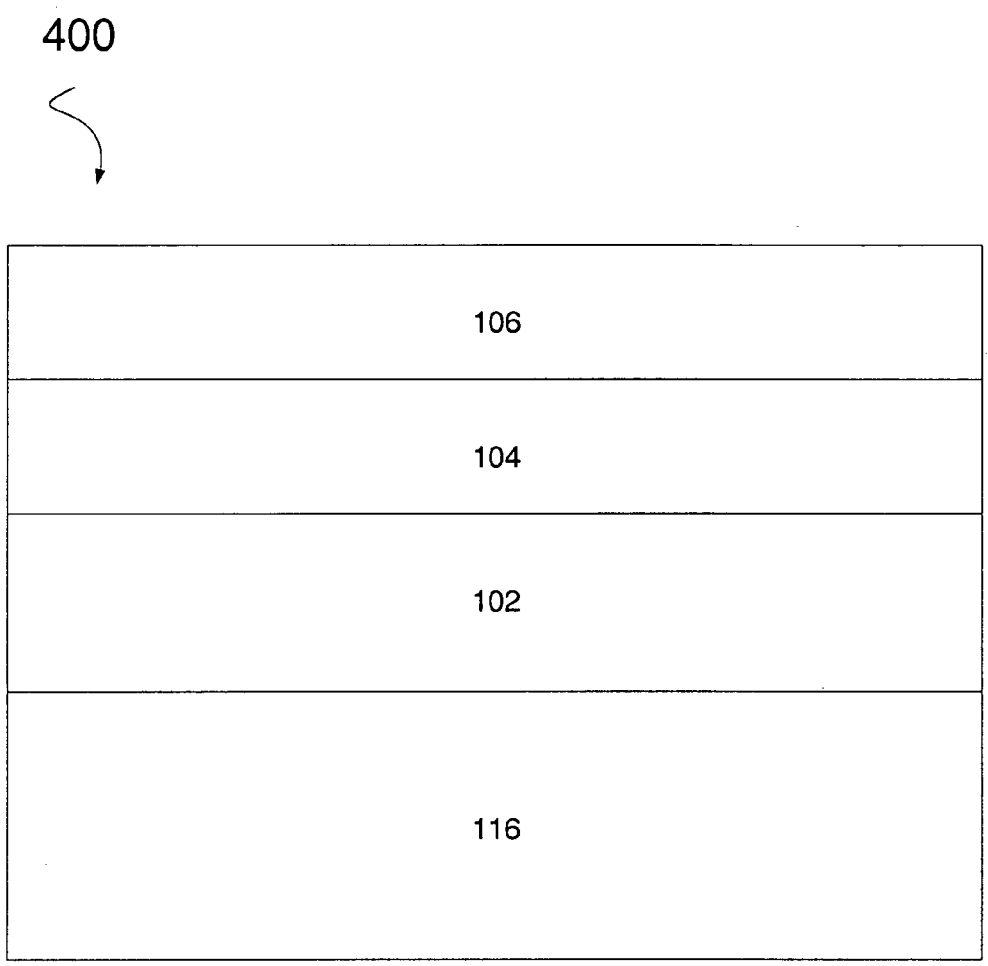
FIGS. 4–11 illustrate, in step-by-step fashion, a process for forming the device of FIG. 1 according to the method of FIG. 3.

FIG. 3 illustrates one example of a method for constructing the device 100 utilizing the present etching method. FIGS. 4–14 illustrate in step-by-step fashion the method of FIG. 3. At step 300, the fabrication process for the device 100 generally begins with an n-p-n stack 400, illustrated in FIG. 4, which may be grown using conventional SiC CVD with Nitrogen and Aluminum as the donor and acceptors, respectively. The stack 400 includes an n-type SiC substrate 116, an n-type collector layer 102, a p-type base layer 104, and an n-type emitter layer 106.

According to the present method, at step 302, an initial conductance of the emitter layer 106 is measured. The measurement may be made via any appropriate means. In one example, the measurement may be made using a conventional four-point probe measurement device 600 and corresponding measurement method. As illustrated, for example, in FIG. 6, this method utilizes four linearly arranged test probes 602, 604, 606, and 608 placed in contact with the layer 106. A current is provided through the outer two probes 602 and 608 while the inner two probes 604 and 606 read a voltage drop created across the layer 106, from which, a layer conductance (C) may be calculated using the relationship between current, voltage, and conductance, e.g. conductance=current/voltage.

Figure 5:
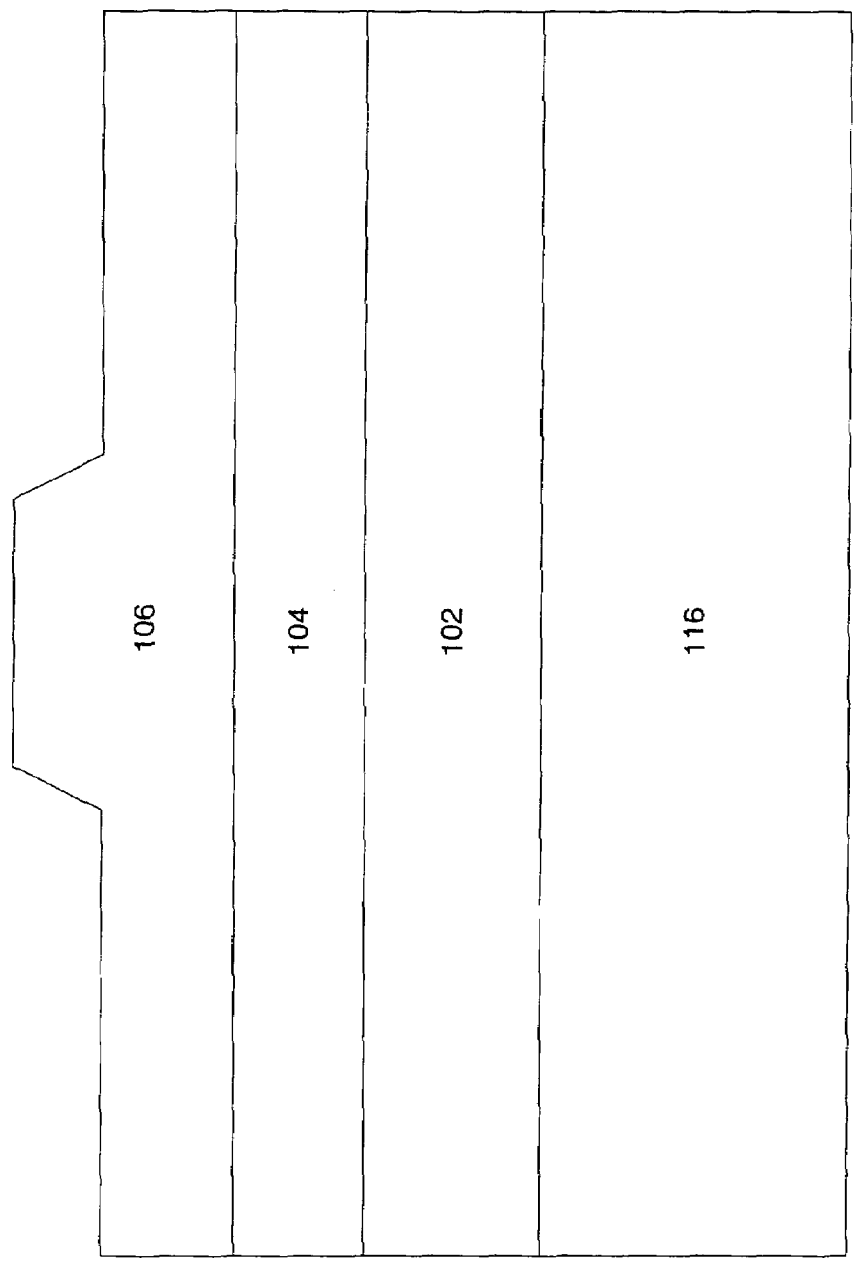
Figure 6:
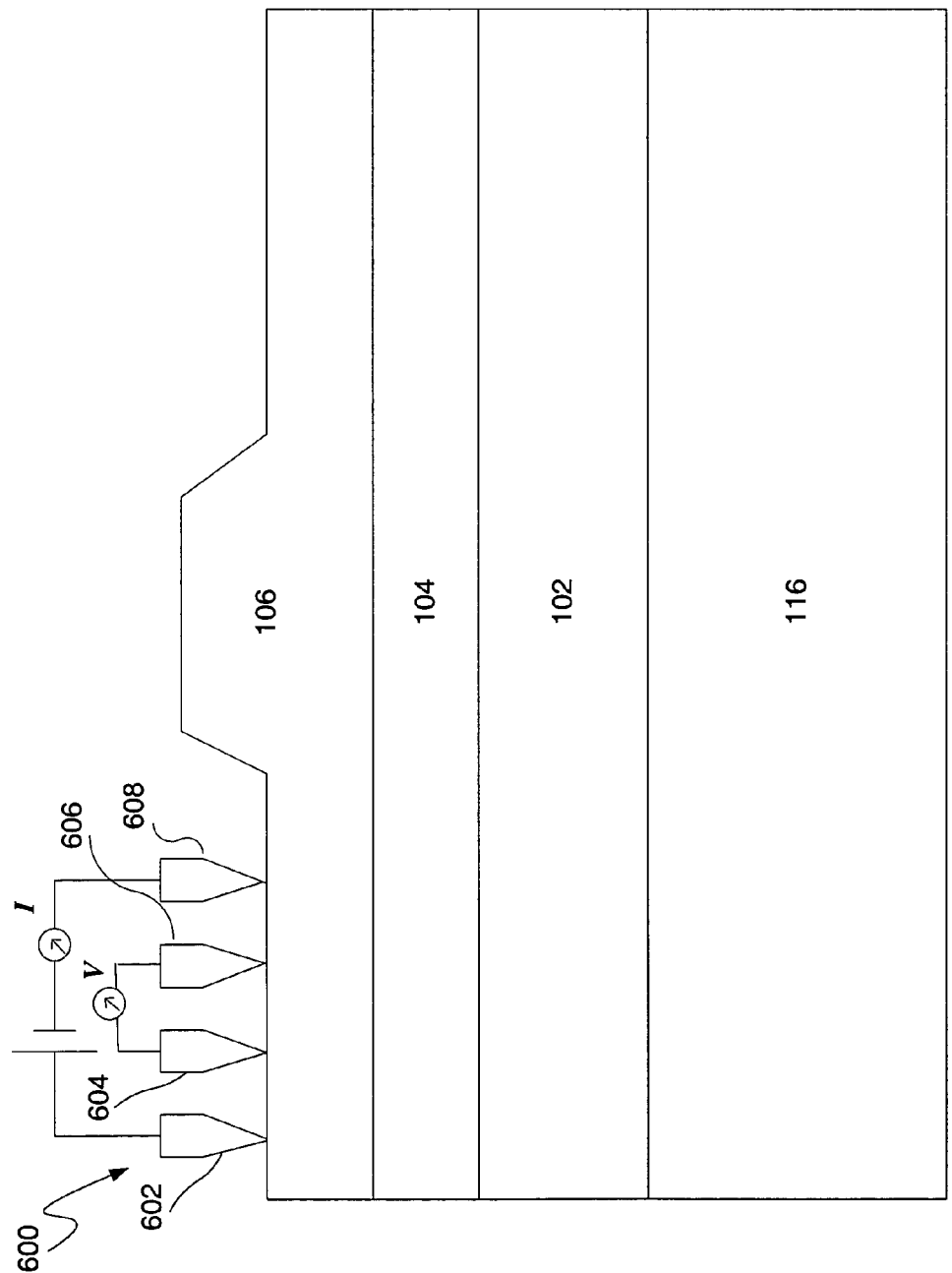

At step 304, a partial etch of the emitter layer 106 is performed to remove a portion of a desired amount of material from the layer 106, to yield the structure of FIG. 5. As an example, the etching step 304 may be a reactive ion etch, ("RIE") as conventionally performed in the art. It will also be appreciated by those skilled in the art that a photoresist mask may be utilized as an etch mask to achieve the mesa structure of FIG. 5. The photoresist mask may be formed by conventional photolithographic processing, such as by using an exposure tool and mask. In one example, the photoresist mask may be formed by spin-coating a layer of photoresist onto the emitter layer 106, baking, and then selectively exposing the photoresist layer to a form of radiation such as ultraviolet light, electrons, or X-rays.

At step 306, another conductance measurement is made of the emitter layer 106 subsequent to the removal of at least a portion of the layer 106 during step 304. At step 310, an etch time required to etch the layer 106 a second amount is calculated. It should be noted that this time may be the time required to complete a desired material removal from the layer 106. The desired material removal, in turn, may include removing an area of layer 106 completely down to the junction with the base layer 104 or alternatively, leaving an accurately and precisely controlled amount of the layer 106 on the base layer 104. In this regard, the conductance of the layer 106 reduces substantially linearly with the etch depth, such that a corresponding relationship is determinable between the etch time and layer conductance, as graphically illustrated in FIG. 2. In particular, the time required to etch the layer 106 the second amount may be interpolated using the initial conductance measurement ($C_1$) taken at time zero (0) and the subsequent conductance measurement ($C_2$) taken at time ($T_1$). Those skilled in the art will appreciate that during the initial partial etch at step 304, most of the of the layer 106 in the desired areas may be removed, leaving only a thin layer of material 106, thereby reducing the time of the second etch. In addition, this provides the added advantage of providing a reference point, e.g. conductance verses time that is relatively close to a desired etch depth, to reduce errors in the second etch time. Alternatively, as illustrated by the dashed line 308, on FIG. 3, steps 304 and 306 may be repeated a predetermined number of times to generate additional points of reference, e.g. ($C_3$), which may improve the accuracy of the second etch time calculation.

Figure 7:
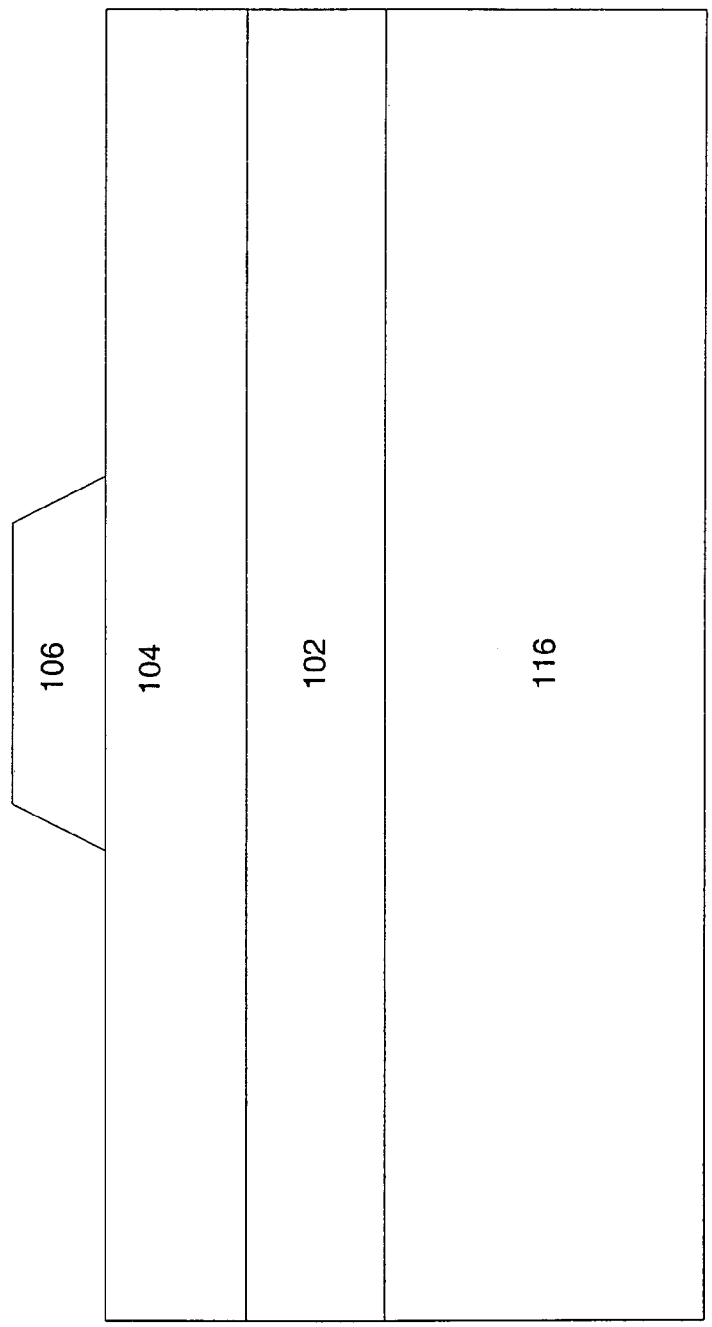
Figure 8:
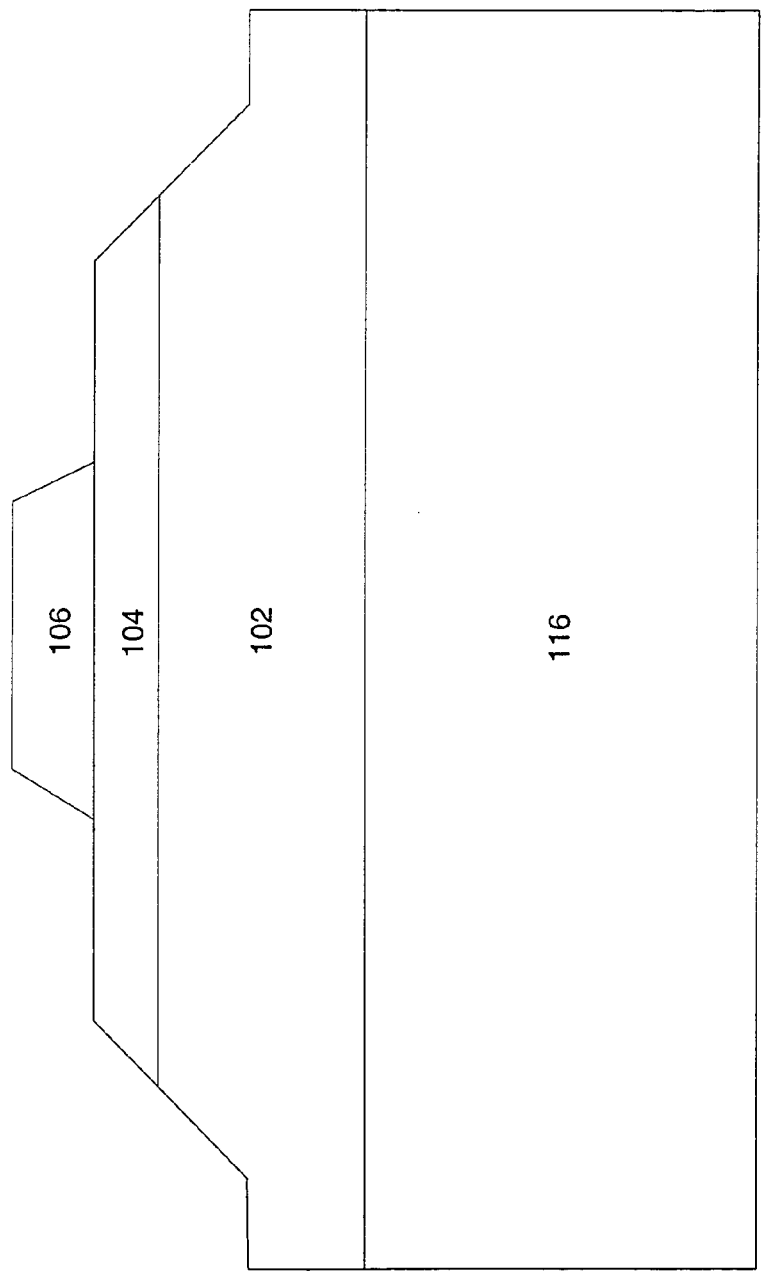

At step 312, a calibrated etch using the calculated etch time is performed to remove a remaining portion of the emitter layer 106 to yield the structure of FIG. 7. Alternatively, as noted above, additional iterations of steps, 304 and 306, may be performed prior to the final etching. Furthermore, the iterative approach may be combined, for instance, with a thermal oxidation followed by a removal of the oxide with hydrofluoric acid to remove very thin layers in a repeatable manner, thereby precisely removing the desired amount of material from the layer 106, while leaving a quality surface. In this regard, it will be appreciated that such a process uses some of the SiC to form the oxide such that the SiC is consumed during the thermal oxidation process and it is possible to remove the thin layers from the surface in a very reproducible way. Thus, in one preferred example, the iterative approach illustrated by the line 308 may be utilized to precisely and controllably etch toward an intercept or junction between the emitter layer 106 and the base layer 104. Advantageously, this approach further defines the etch time required to precisely and accurately etch emitter layers during construction of subsequent devices from the same n-p-n material stack. Thus, the etch time for the device 100, constructed according to the present method, may be utilized as a pattern from which other devices may be constructed from the same material stack using a single etch step to precisely and accurately etch the emitter layer a desired amount.

At step 314, the photoresist mask utilized to form the emitter mesa 108 may be removed followed by a cleaning step 316 to remove any cross-linked photoresist and provide a clean smooth surface. In one example, the cleaning step 316 could include RIE etching in pure oxygen at 1 Torr and 100 W power for 30 seconds, followed by thermal oxidation at 1150° C. and removal of the oxide.

At step 318, an isolation etch step, e.g. an RIE, may be utilized to remove a portion of the base 104 and collector 102. As with the emitter mask, a photoresist mask may be employed to achieve the resulting isolation mesa structure of FIG. 8. In this regard, the isolation mesa formed by the etch operates to isolate the emitter-base junction from the remainder of the device 100. Additionally, as with the etching step 304, a single or multiple iterations of conductance measurement and partial etching may be performed at step 318 to determine the etch time required to remove a desired amount of material from the device 100 during the isolation etch.

Figure 9:
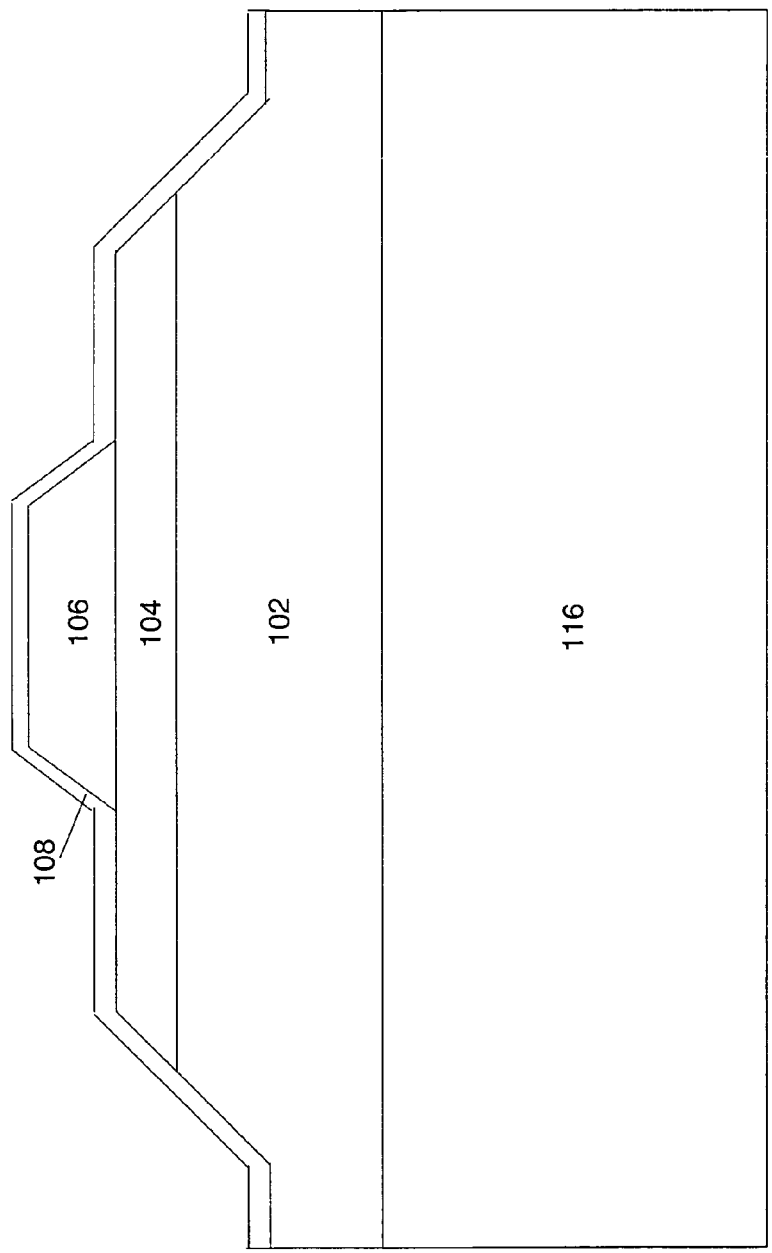
Figure 10:
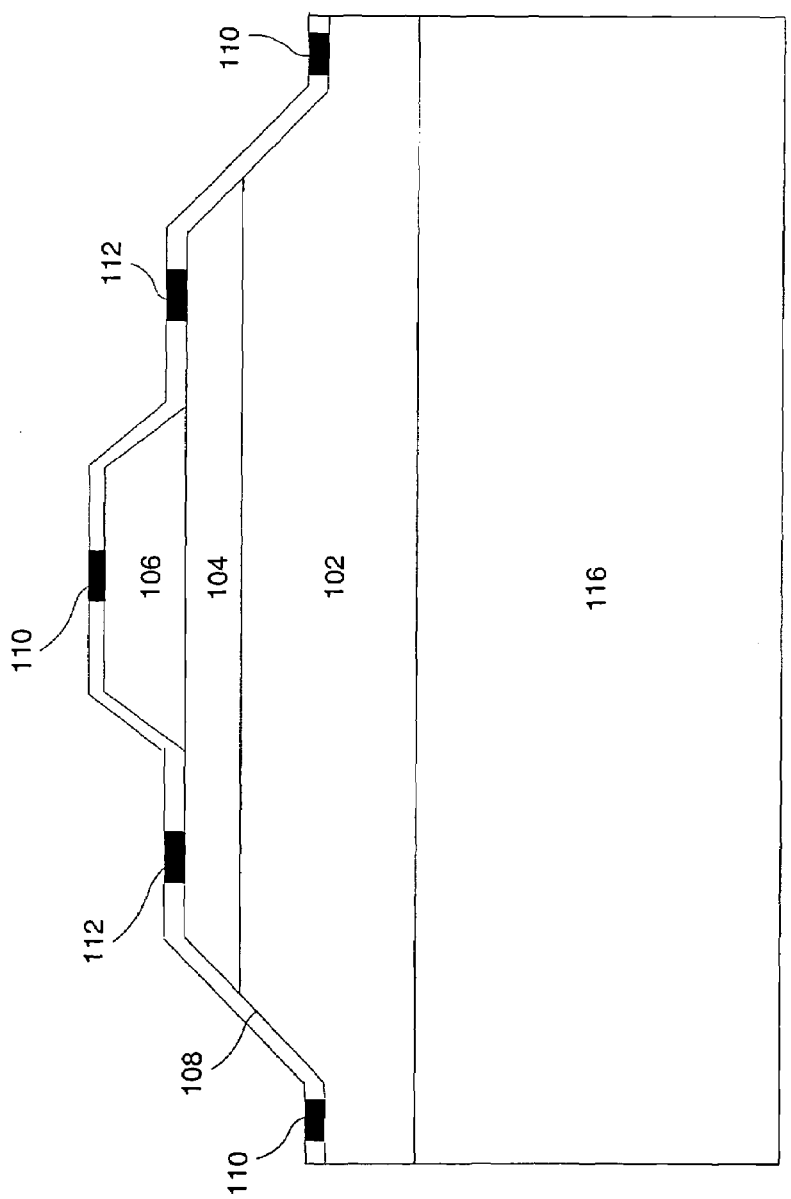
Figure 11:
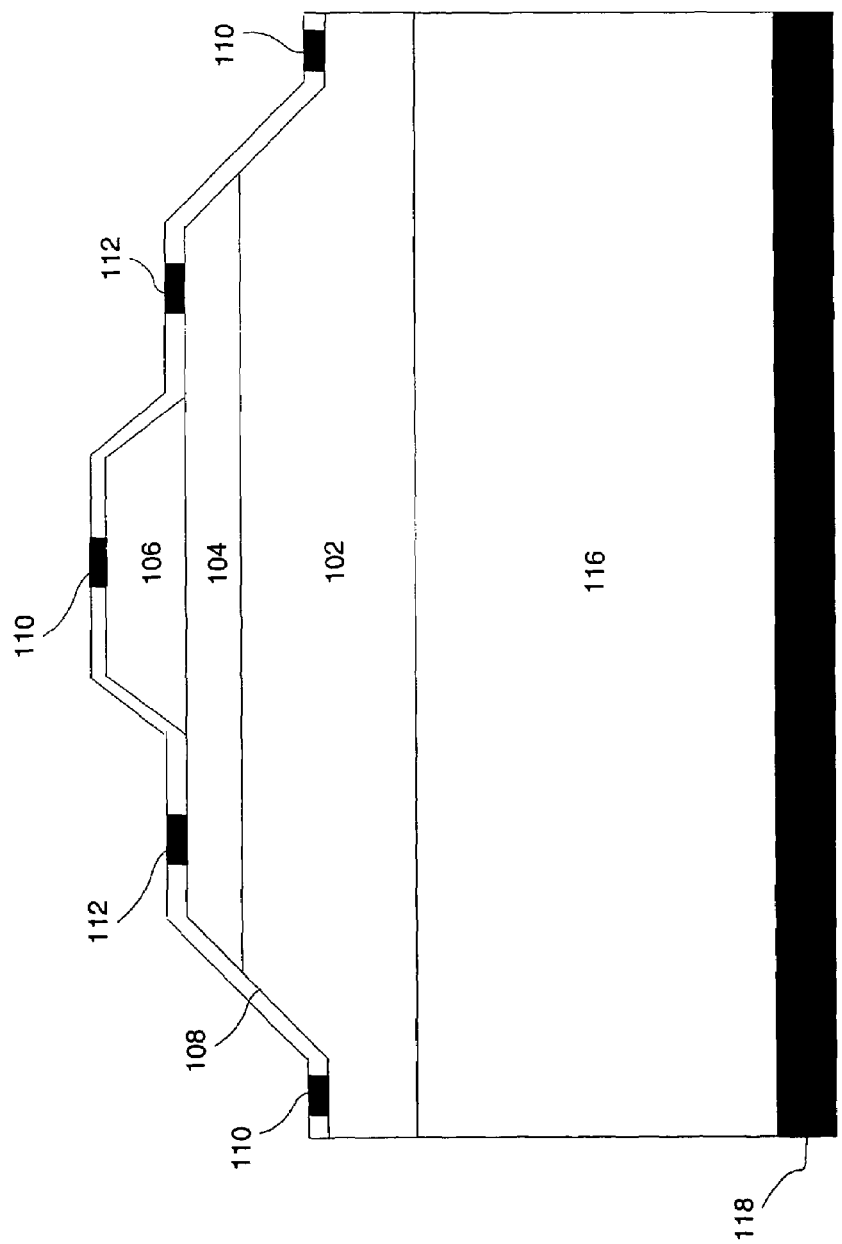

At step 320, an oxide layer is added as illustrated in FIG. 9. Of note, the oxide layer forms the passivation layer 108 to prevent leakage of current by isolating the SiC of the emitter 106. At step 322, base and emitter contact metals 112 and 110 may be added as illustrated in FIGS. 10 and 11. Some examples of base and emitter contact metals include without limitation, nickel (Ni) for the n-type contacts 110, and aluminum alloy (e.g. Al/Ti) for the p-type contacts 112. In this regard, the contacts may be either a single layer or a multi-layer electrode. High-temperature annealing of the base and emitter contacts 112 and 110 may also be required in some cases depending on doping densities of the base layer 104 and the emitter 106. It should also be noted that the metal used for the base and emitter contacts 112 and 110 is not limited to nickel and aluminum alloy, but generally may be any high work function metal. Finally, at step 324, a collector contact 118 is applied in a conventional manner to the bottom surface of the conductive substrate 116, as shown in FIG. 11. At step 326, the process ends. It will be appreciated, however, that device 100 could be constructed with a nonconductive substrate, in which case, the collector contact 110 may be applied to another conductive surface.

Figure 12:
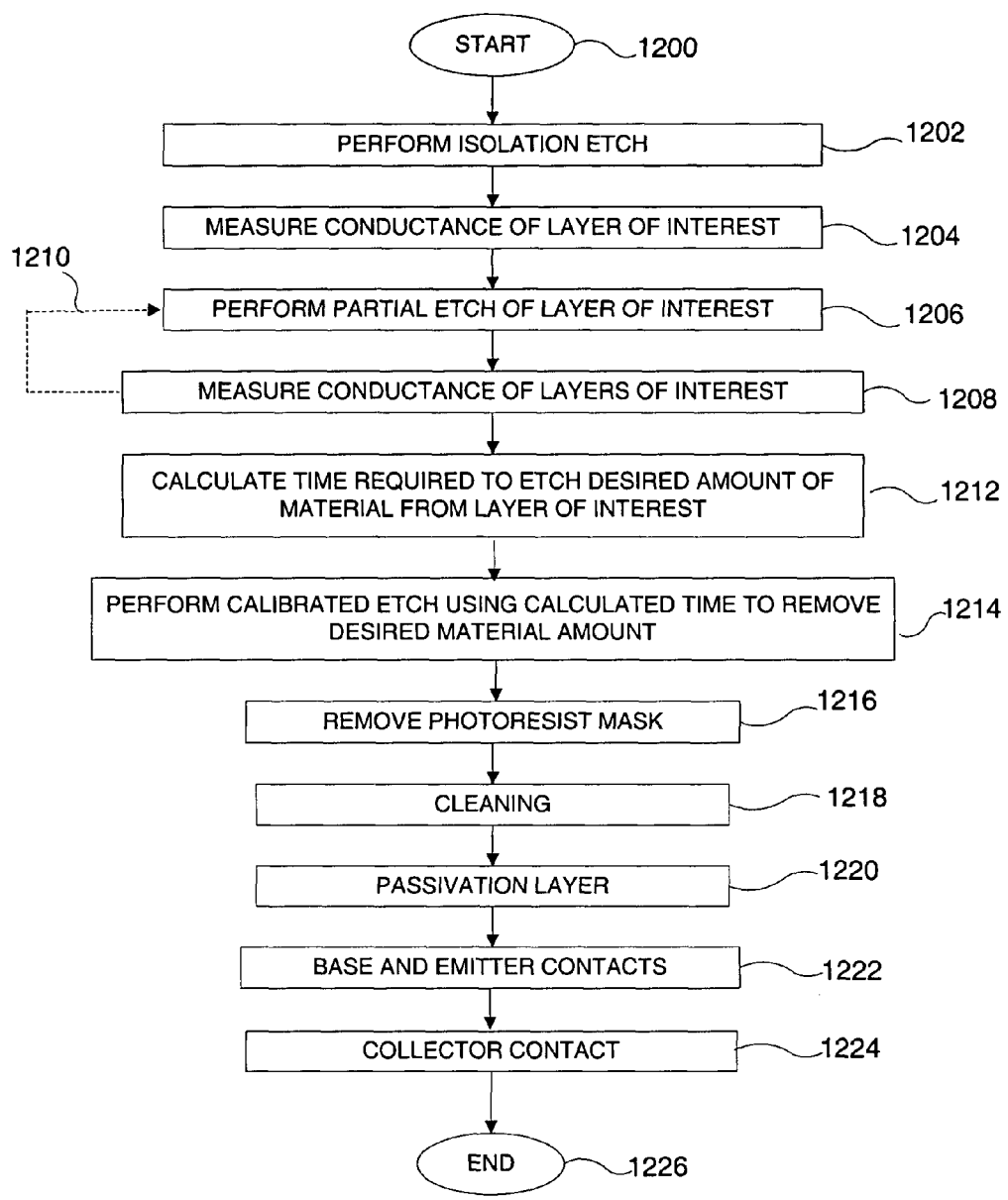
FIG. 12 is a flow chart illustrating another example of a method of etching a wide bandgap semiconductor device.
Figure 13:
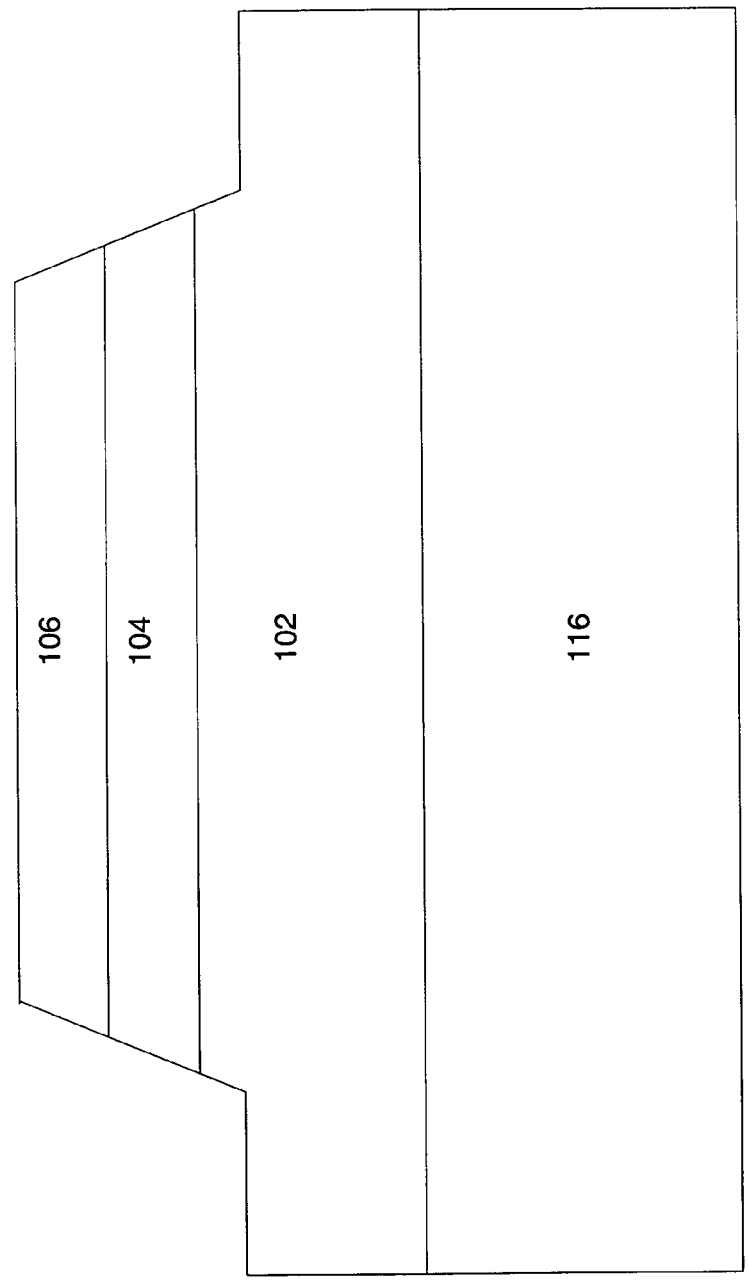
FIGS. 13–14 illustrate, in step-by-step fashion, a portion of the process for forming the device of FIG. 1 according to the method of FIG. 12.
Figure 14:
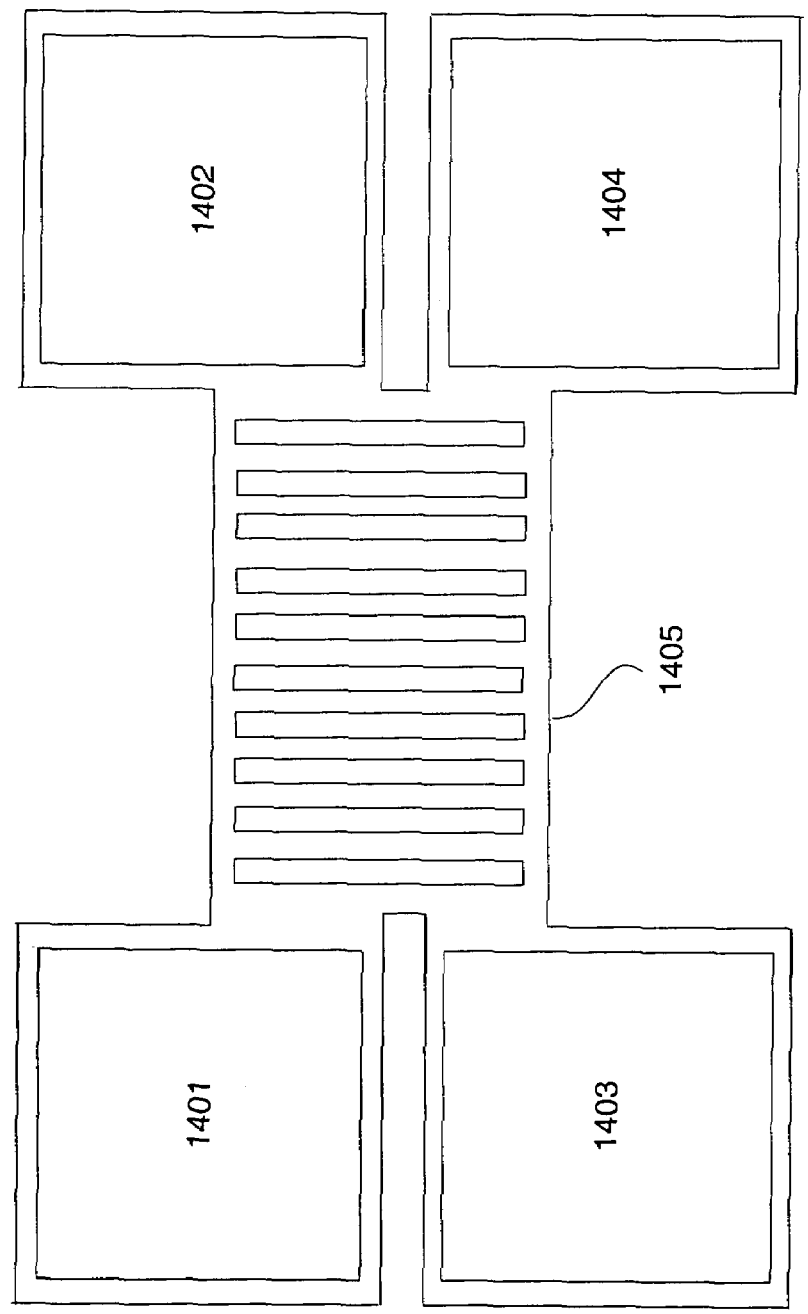

FIG. 12 illustrates another example of a method for constructing the device 100. As with the previous method, the fabrication process for the device 100 generally begins at step 1200 with an n-p-n stack 400, illustrated in FIG. 4. In contrast to the above example, however, at step 1202, an isolation etch, e.g. an RIE, is performed to remove a portion of the emitter 106, the base 104, and the collector 102, prior to etching the emitter layer 106. In this case, the isolation etch at step 1202 forming the mesa structure of FIG. 13, not only operates to isolate the emitter-base junction from the remainder of the device 100, but further results in a specific structure that improves the accuracy of the above described four-point probe measurement during subsequent etching of the emitter layer 106. Specifically, as illustrated in FIG. 14, the isolation etch results in a structure consisting of four square isolation regions 1401, 1402, 1403, and 1404 (hereinafter 1401–1404) connected to a middle rectangular region 1405. In this regard, the outer perimeters of the structure are obtained by etching through the emitter and base layers 106 and 104 respectively and partially into the collector layer 102 during the isolation etch of step 1202. As will be appreciated, during the etch at step 1202, either the whole structure may be etched, or narrow trenches may be formed in the region 1405 to detect size-dependent etching. In this regard, the trenches form a series of closely spaced features that compensate for variations in etching, e.g. tapers etc.

At step 1204, an initial conductance of the emitter layer 106 is measured, as described above, except that a respective one of the four probes 602–608 is located on a respective one of the isolation regions 1401–1404. Advantageously, the architecture of the isolation regions 1401–1404, improves the accuracy of the conductance measurement by isolating the current flow path in the layer 106 thereby minimizing influence by other features, such as emitter mesas in close proximity and/or defects in the semiconductor material making up the layer 106. In this regard, the isolation regions 1401–1404 also minimize current leakage, which affects the conductance measurement of the emitter layer 106. As will be appreciated by those skilled in the art, such leakage may be laterally outward and/or vertically downward depending on the size of the device and defects present in the device.

At step 1206, a partial etch of the emitter layer 106, using for example an RIE, is performed to remove a portion of a desired amount of material from the layer 106. As with the above embodiment, a photoresist mask may be utilized during etching to form the emitter mesa. At step 1208, another conductance measurement is made of the emitter layer 106 subsequent to removal of at least a portion of the layer 106 during step 1206. At step 1212, a time required to etch the layer 106 a second amount is calculated as set forth above. Furthermore, as noted above, this time may be the time required to complete the etching of the layer 106, or alternatively, as illustrated by the dashed line 1210 further iterations of etching and measuring at steps 1206 and 1208 respectively, may be performed to generate additional data from which a final etch time may be determined. At step 1214, one or more calibrated etches using the calculated etch time is/are performed to remove a remaining portion of the emitter layer 106 to yield the structure of FIG. 8. As noted above the calibrated etch may be a thermal oxidation followed by a removal of the oxide with hydrofluoric acid to controllably remove very thin layers of the layer 106.

At step 1216, the photoresist mask utilized to form the emitter mesa structure may be removed followed by a cleaning step 1218 to remove any cross-linked photoresist and provide a clean smooth surface. At step 1220, the oxide layer is added as illustrated in FIG. 9 forming the passivation layer 108. At step 1222, base and emitter contact metals 112 and 110 are added as illustrated in FIGS. 10 and 11, followed by a high-temperature annealing as required. Finally, at step 1224, the collector contact 118 is applied to the bottom surface of the substrate 116 to complete the device 100, as illustrated in FIG. 11. At step 1226, the process ends.

Figure 15:
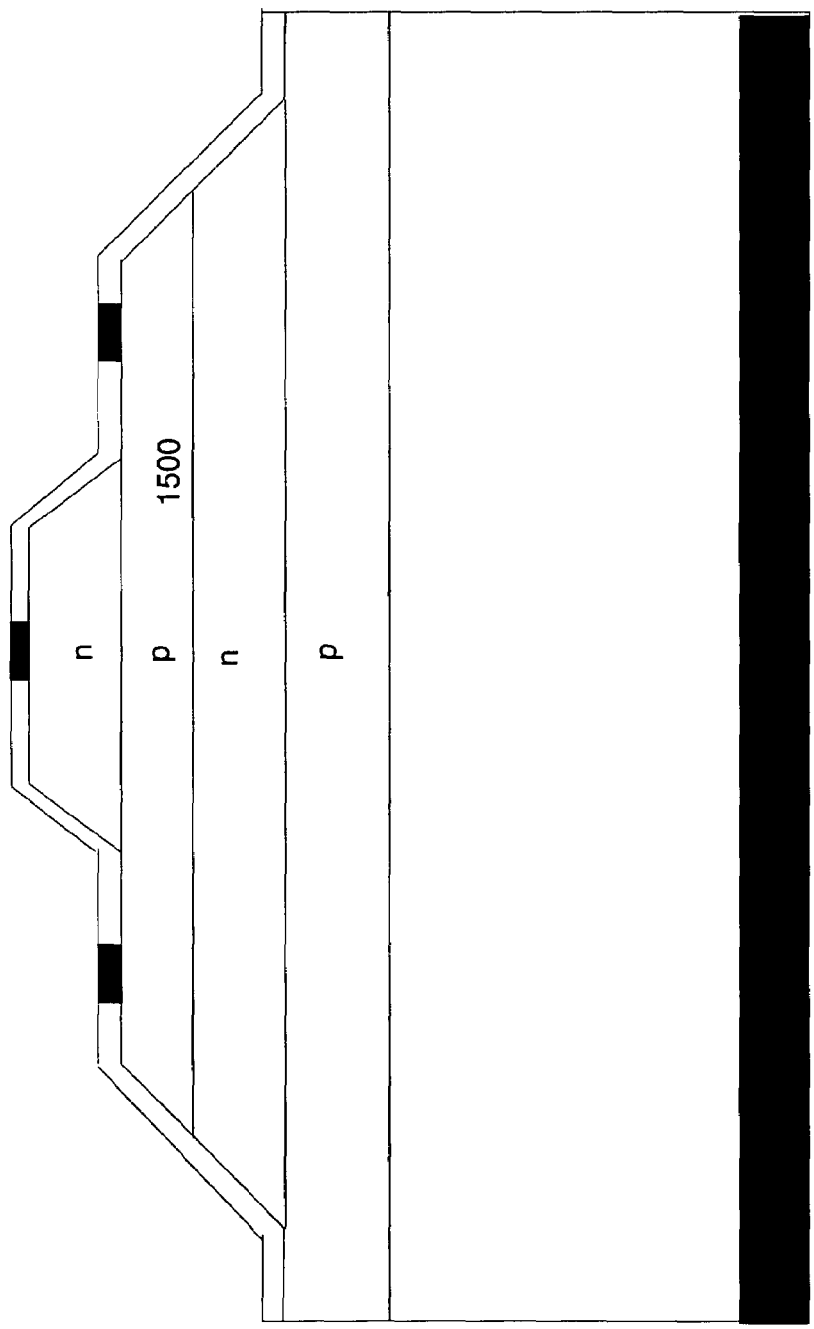
FIG. 15 is another example of a wide bandgap semiconductor device formed in accordance with the principles of the present invention.
Figure 16:
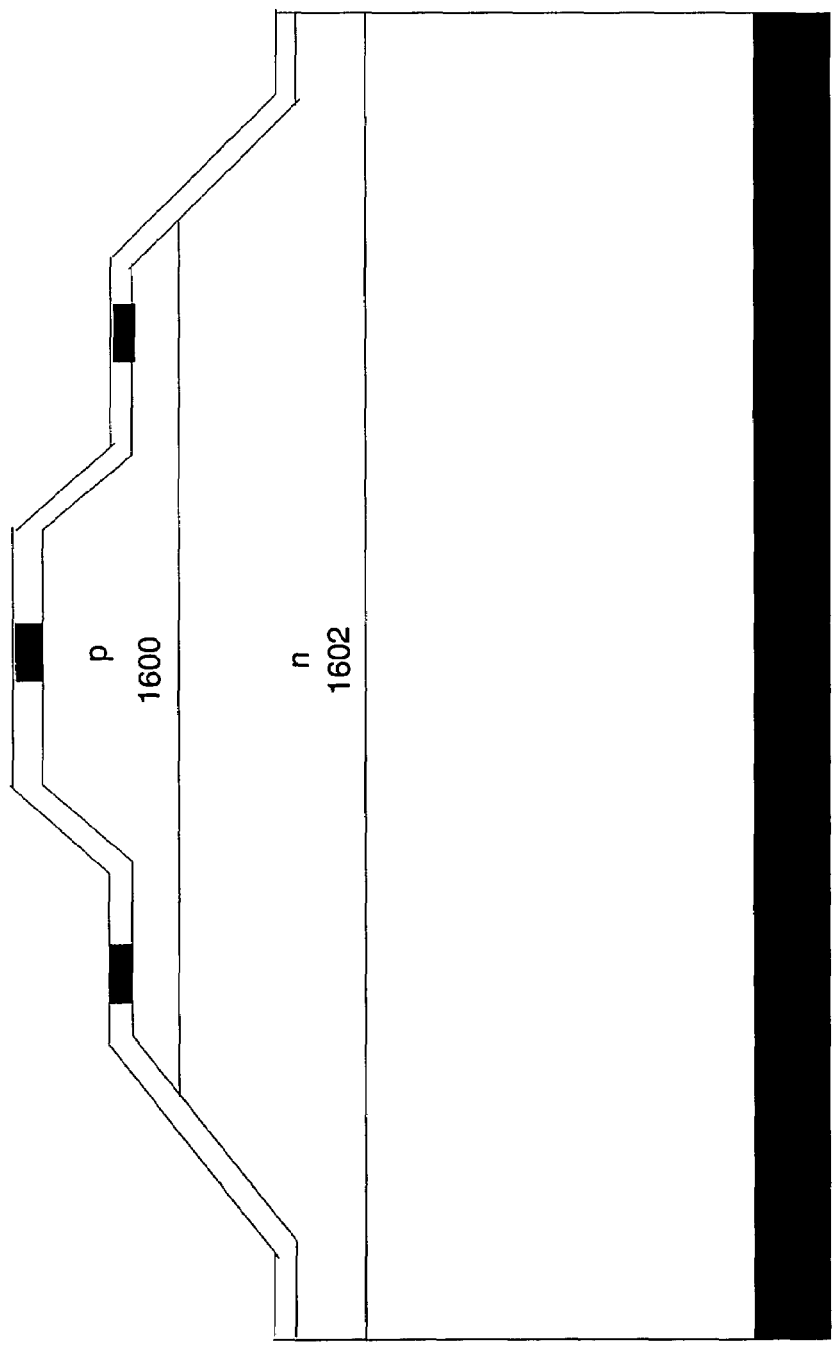
FIG. 16 is another example of a wide bandgap semiconductor device formed in accordance with the principles of the present invention.

Advantageously, the technique of utilizing the four-point probe measurement in combination with the isolated test structure of FIG. 14 provides a method for accurately and precisely etching down to an emitter-base junction in a device such as the bipolar junction transistor 100. Also advantageously, however, the same technique may be used for other wide bandgap devices that contain one or more p-n junctions. One example is a thyristor, illustrated in FIG. 15, having a n-p-n-p or p-n-p-n structure, where the second layer 1500 from the top must be exposed so that contact can be made to the layer 1500. Another example is a high voltage p-n diode with a termination structure consisting of a thin p-type layer 1600 on top of the n-type layer 1602 as illustrated in FIG. 16. Such structure is known to improve the breakdown characteristics of the p-n diode. In this regard, the above method may be used to determine when to terminate etching such that a layer 1600 of controlled thickness remains on the layer 1602. Thus, according to this example, the calculated etch time is shorter than what is needed to fully remove the p-type layer 1600. Accordingly, it may be desirable in this case to utilize the iterative approach set forth above to achieve the optimal etch depth and determine the corresponding etch time.

Figure 17:
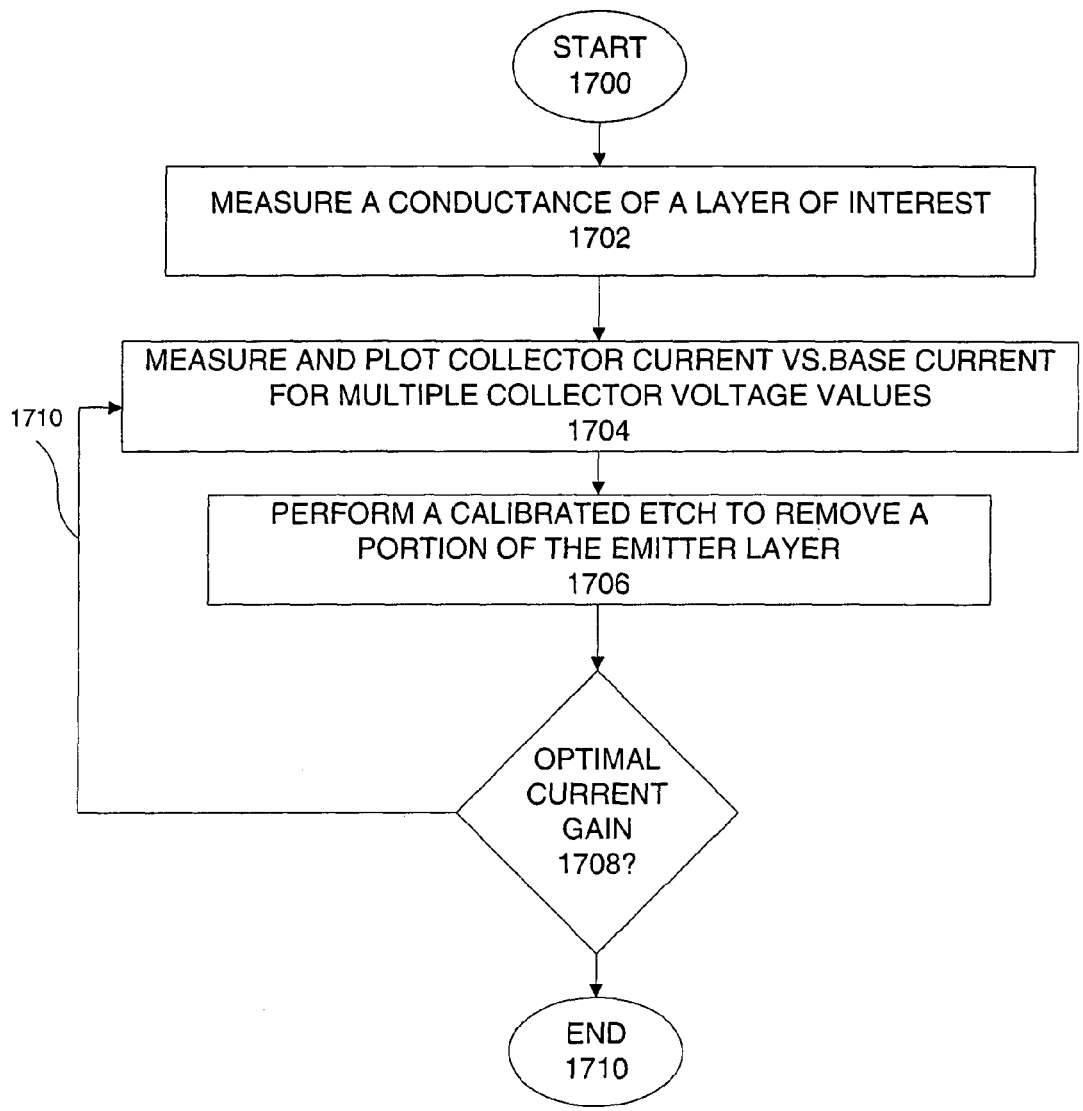
FIG. 17 is a flow chart illustrating an example of a method of testing a wide bandgap semiconductor device.
Figure 18:
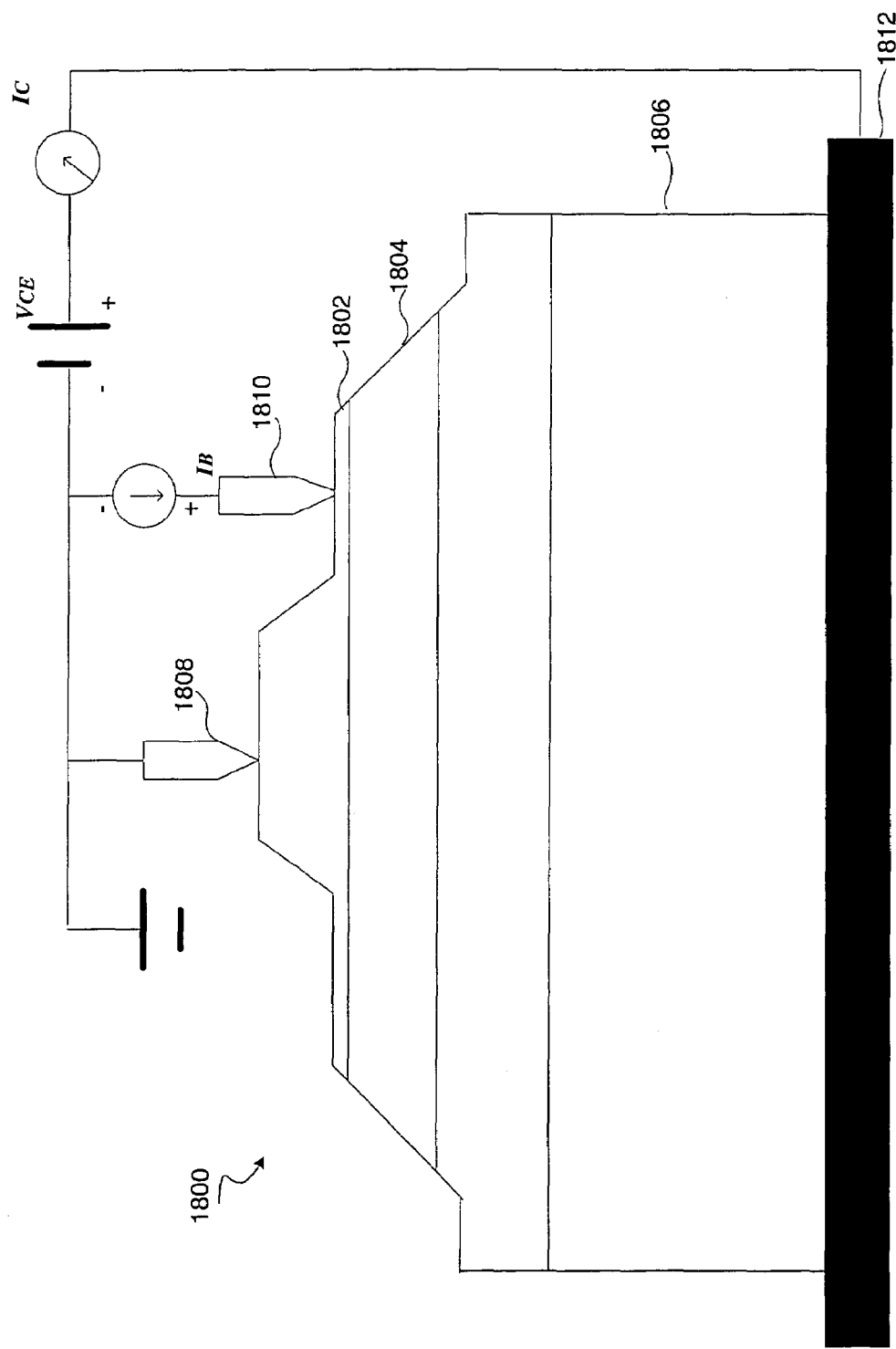
FIG. 18 illustrates additional detail of the method of FIG. 17.

FIG. 17 is a flow chart illustrating an example of a method for testing Bipolar devices, such as device 100, during construction of the same. Referring also to FIG. 18, the present method begins at step 1700 with a partially constructed bipolar device such as device 1800. At step 1702, an initial conductance of the emitter layer 1802 is measured. In this regard, the measurement is slightly different than described above, in that now the emitter layer 1802 and base layer 1804 are both contacted with probes 1808 and 1810, while the collector 1806 is contacted by placing the wafer on a conducting (metal) surface 1812. In this regard, the conductance measurement includes applying a current to the base probe 1810 and a voltage to the collector probe 1806 while grounding the emitter probe 1808. At step 1704, the collector current is measured and plotted for each value of the base current for multiple collector voltage values. At step 1706, a calibrated etch is performed to remove a portion of the emitter layer 1802. Thereafter, the process is repeated such that the current gain and other characteristics of interest can be obtained to determine the quality of device and an optimum etch depth for a given layer, e.g. emitter layer 1802. In other words, the measurement and etching may be iteratively performed until a desired device quality as indicated by the current gain is achieved, at step 1708. Thereafter, the method ends at step 1710. Advantageously, the above method may be performed on a single device to identify an optimum etch depth and time for a given layer structure. Thereafter, this data may be utilized during the construction of subsequent devices from the same batch of wafer material to achieve the desired device performance without performing the above method on each individual device.

It will be appreciated, that as noted, the above example of the transistor 100 is one of many types of semiconductor devices that may be constructed in accordance with the principles of the present invention. Furthermore, those skilled in the art will appreciate variations of the disclosed processes as well as other similar processes that may be utilized in accordance with the teachings of the present invention to form wide bandgap semiconductor devices. Those skilled in the art will further appreciate variations of the above-described embodiments that fall within the scope of the invention. As a result, the invention is not limited to the specific examples and illustrations discussed above, but only by the following claims and their equivalents.

What is claimed is:

1. A method for precisely etching a wide bandgap semiconductor device, the method comprising the steps of:
   (a) providing a multi-layer laminate including at least a first and second layer of wide bandgap semiconductor material;
   (b) isolating an area of the first layer of semiconductor material for locating a conductance measurement device;
   (c) measuring a first conductance of the isolated area of the first layer of semiconductor material using the conductance measurement device;
   (d) first etching a first amount of the first layer of semiconductor material;
   (e) measuring a second conductance of the isolated area of the first layer of semiconductor material subsequent to etching the first amount of the first layer of semiconductor material; and
   (f) utilizing the first and second measured conductance to determine a time required to etch a second amount of the first layer of semiconductor material.

2. The method of claim 1 the method comprising:
   repeating steps (d) through (f) to determine an optimal time to etch the second amount of the first layer of semiconductor material to achieve a desired etch depth.

3. The method of claim 1 wherein the utilizing step includes:
   determining a difference between the first measured conductance and the second measured conductance; and
   calculating the time required to remove the second amount of the first layer of semiconductor material using the difference between the first measured conductance and the second measured conductance and a time required to complete the first etching step.

4. The method of claim 1 the method comprising:
   repeating steps (d) through (f) to identify an optimum etch depth for the first layer of semiconductor material.

5. The method of claim 1 wherein the first layer of semiconductor material includes a first conductivity type and the second layer of semiconductor material includes a second conductivity type different from the first conductivity type.

6. The method of claim 1 wherein the device is a radio frequency power device.

7. The method of claim 1 wherein the device is a p-n junction.

8. The method of claim 1 wherein the device is a transistor.

9. The method of claim 1 wherein the device is a thyristor.

10. The method of claim 1 the method comprising:
subsequent to the utilizing step, second etching the first layer of semiconductor material for the determined amount of time to remove the second amount of the first layer of semiconductor material.

11. The method of claim 10 wherein the second etching step comprises:
etching at least a portion of the first layer of semiconductor material to a junction between the first and second layer of semiconductor material.

12. The method of claim 10 wherein the second etching step comprises:
removing at least a portion of the first layer of semiconductor material to achieve a predetermined thickness of the at least a portion of the first layer of semiconductor material.

13. A method for precisely etching a wide bandgap semiconductor device, the method comprising the steps of:
(a) providing a multi-layer laminate including at least a first and second layer of wide bandgap semiconductor material;
(b) measuring a first conductance of the first layer of semiconductor material;
(c) first etching the first layer of semiconductor material a first amount;
(d) measuring a second conductance of the first layer of semiconductor material etched the first amount; and
(e) repeating steps (c) and (d) to determine an optimal time to etch the first layer of semiconductor material a second amount.

14. The method of claim 13 the method comprising:
determining a difference between the first measured conductance and the second measured conductance; and
calculating the optimal time using the difference between the first measured conductance and the second measured conductance and a time required to complete the first etching step.

15. The method of claim 13 the method comprising:
repeating steps (c) and (d) to identify an optimum etch depth for the first layer of semiconductor material.

16. The method of claim 13 wherein the first layer of semiconductor material includes a first conductivity type and the second layer of semiconductor material includes a second conductivity type different from the first conductivity type.

17. The method of claim 13 wherein the device is a radio frequency power device.

18. The method of claim 13 wherein the device is a p-n junction.

19. The method of claim 13 wherein the device is a transistor.

20. The method of claim 13 wherein the device is a thyristor.

21. The method of claim 13 the method comprising:
subsequent to the providing step, isolating an area of the first layer of semiconductor material for locating a conductance measurement device.

22. The method of claim 21 wherein the step of measuring the first conductance comprises:
measuring the first conductance of the isolated area of the first layer of semiconductor material using the conductance measurement device.

23. The method of claim 13 the method comprising:
subsequent to the repeating step, second etching the first layer of semiconductor material for the determined optimal amount of time to remove the second amount of the first layer of semiconductor material.

24. The method of claim 23 wherein the second etching step comprises:
etching at least a portion of the first layer of semiconductor material to a junction between the first and second layer of semiconductor material.

25. The method of claim 23 wherein the second etching step comprises:
removing at least a portion of the first layer of semiconductor material to achieve a predetermined thickness of the at least a portion of the first layer of semiconductor material.

26. A method for use in semiconductor fabrication comprising:
establishing a mathematical correlation for determining an etch time for etching a material, the mathematical correlation reflecting a relationship between a conductance of a layer of said material and a thickness of said layer, wherein said layer conductance reduces with etching of said layer thickness;
using the mathematical correlation to determine an etch time for etching an amount of the material; and
using said determined etch time to produce a multi-layer laminate including at least a first and second layer of wide bandgap semiconductor material.

27. The method of claim 26 wherein an initial layer thickness remains unknown.

28. A method for use in semiconductor fabrication comprising:
establishing a mathematical correlation for determining an etch time for etching a material, the mathematical correlation reflecting a relationship between a conductance of a layer of said material and a thickness of said layer, wherein said layer conductance reduces with said layer thickness; and
using the mathematical correlation to determine an etch time for etching an amount of the material,
wherein said step of establishing comprises
(a) obtaining a first conductance measurement of a layer and a second conductance measurement of the layer, wherein the first conductance measurement of the layer is obtained before an etch of the layer and the second conductance measurement of the layer is obtained after the etch of the layer; and
(b) using the first conductance measurement of the layer and the second conductance measurement of the layer to determine the etch time for etching an additional amount of the layer of material.

29. The method of claim 28 comprising:
repeating steps (a) and (b) to achieve an optimum etch depth for the layer of material.

* * * * *